United States Patent [19]

Salchli

[11] Patent Number: 4,656,574
[45] Date of Patent: Apr. 7, 1987

[54] LOGIC SIGNAL MULTIPLIER CIRCUIT

[75] Inventor: Francois H. Salchli, Neuchatel, Switzerland

[73] Assignee: Centre Electronique Horloger, Switzerland

[21] Appl. No.: 651,335

[22] Filed: Sep. 17, 1984

[30] Foreign Application Priority Data

Sep. 21, 1983 [CH] Switzerland .................. 5127/83

[51] Int. Cl.$^4$ ............................................. H02M 7/25
[52] U.S. Cl. ....................................... 363/60; 363/70; 320/1; 307/110
[58] Field of Search ................... 363/59, 60, 69, 70; 307/110; 320/1

[56] References Cited

U.S. PATENT DOCUMENTS

| | | | |
|---|---|---|---|
| 3,944,908 | 3/1976 | Oki | 363/60 |
| 4,041,522 | 8/1977 | Oguey et al. | |
| 4,068,295 | 1/1978 | Portmann | |
| 4,259,600 | 3/1981 | Fellrath et al. | |
| 4,559,483 | 12/1985 | Jundt et al. | 363/60 |

OTHER PUBLICATIONS

E. Vittoz, "Microwatt Switched Capacitor Circuit Design", 1982, Electrocomponent Science and Technology, vol. 9, pp. 263-273.

"A CMOS Voltage Reference", By Tsividis, Ulmer, IEEE Journal of Solid State Circuits, vol. SC-13, No. 6, Dec. 1978.

Primary Examiner—Patrick R. Salce
Assistant Examiner—Anita M. Ault
Attorney, Agent, or Firm—Parkhurst & Oliff

[57] ABSTRACT

There is disclosed a logic signal multiplier circuit which includes the interconnection of a plurality of inverters having outputs interconnected by a capacitor. Each of the inverters includes complementary transistors having their gates connected to a common terminal such that each inverter may be controlled by a separate clock control signal. The control signals are coupled to provide a three-phase operation of the circuit which insures (1) charging of the capacitor between the outputs of the inverters during a first time period, (2) an increase of the voltage at a node of one of the inverters to a value which is twice the value of the supply voltage driving the inverters during a second time period, and (3) coupling of that same node to ground during a third time period. Diodes are interconnected in each of the inverter circuits to prevent discharge of the capacitor during times that selected ones of the transistors forming the inverter circuits are conductive.

14 Claims, 9 Drawing Figures

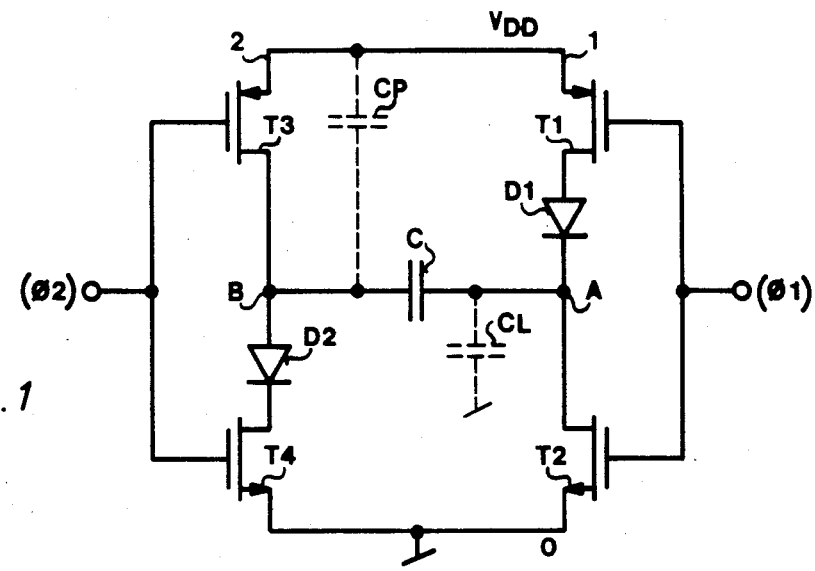
FIG. 1
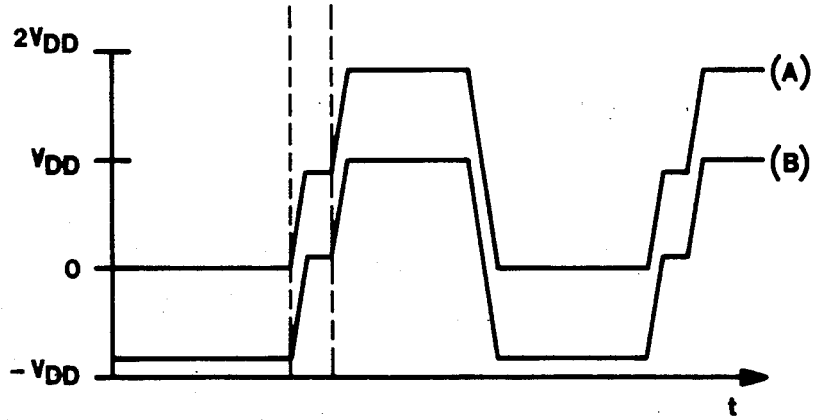
FIG. 2.a (ø1)
FIG. 2.b (ø2)
FIG. 2.c

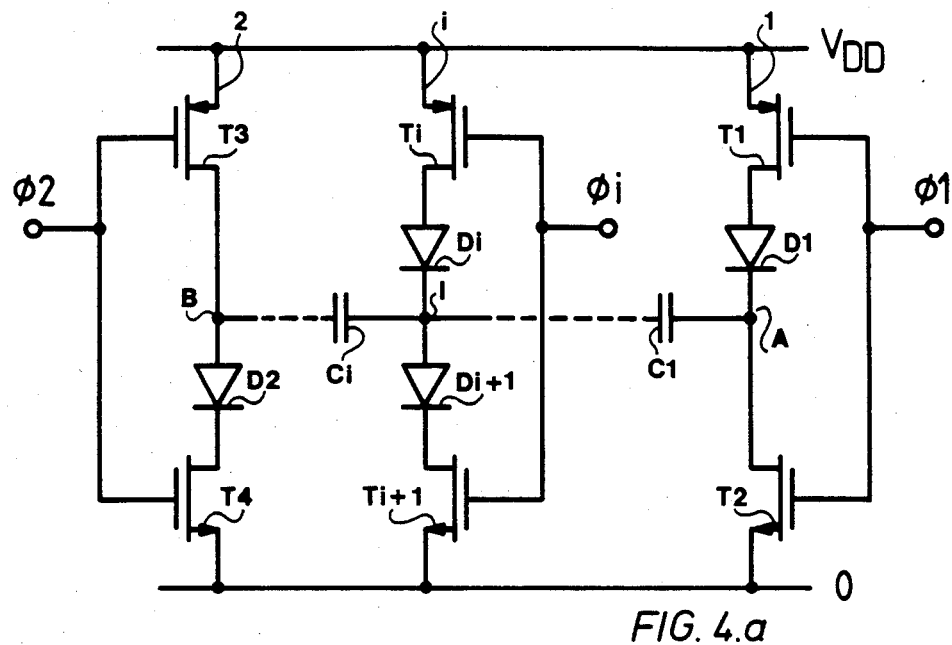
FIG. 4.a
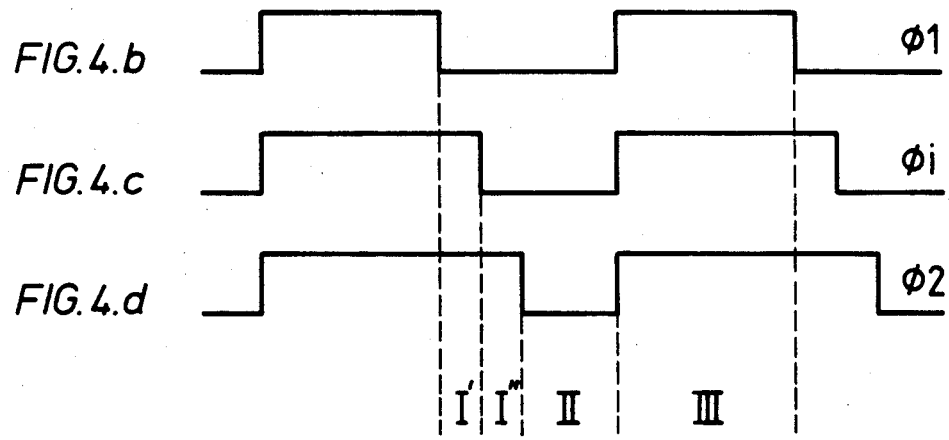
FIG. 4.b  $\phi 1$
FIG. 4.c  $\phi i$
FIG. 4.d  $\phi 2$
I' I" II III

LOGIC SIGNAL MULTIPLIER CIRCUIT

BACKGROUND OF THE INVENTION

The present invention relates to logic circuits and, more particularly, to logic signal multiplier circuits having low power consumption.

In small volume portable devices, such as watches, pocket calculators, hearing aids, etc., employing electronic circuits, most such electronic circuits are supplied from batteries or cells providing a supply voltage having standardized voltages of 1.5 volts, or in the case of lithium cells, 3 volts. In such devices, certain techniques (including particular CMOS techniques) have been developed to insure correct operation of the electronic circuits at such relatively low voltages. Nevertheless, there are still applications in which it is necessary to obtain higher voltages from the electronic circuits than are provided by the supply voltage.

In a known example involving the control of display devices (including liquid crystal displays or stepping motors) such problems have been resolved in one instance by the use of diode voltage multipliers, as described in Swiss Pat. No. 621917. In another instance, the problem has been addressed by the use of a multiplier similar to the aforementioned Swiss patent in which the diodes are replaced by MOS transistors, as described in Swiss Pat. No. 593510. In such instances, however, this type of multiplier has low power efficiency which limits its application to the control of relatively slow circuits.

The ability to provide voltage multipliers is also particularly important in the field relating to switched capacitor circuits. In such circuits, capacitors, amplifiers and switches are used to insure the transfer of charges between the capacitors in accordance with predetermined sequences. Such circuits are described in an article entitled "Microwatt Switched Capacitor Circuit Design" by E. Vittoz, in *Electro Component Science and Technology*, Volume 9, No. 4, 1982, pp. 263–273. As previously indicated, one of the basic elements of such circuits is the switch, which is implemented using MOS transistors. Such transistors are usually controlled by signals that have values which do not exceed the value of the supply voltages. In a p- or n-channel MOS transistor, such limitation imposed by the supply voltage on the control signal prevents the assurance of total conduction for all values of voltage applied to the drain of such a transistor. As a result, a transmission gate, formed by placing a p-channel MOS transistor and an n-channel MOS transistor in parallel and controlled by opposite phase signals, is often employed to reduce the disadvantages noted above. However, such an implementation requires the use of two transistors and two control signals per switch, thereby requiring the employment of significant circuit area when large numbers of switches are involved.

Accordingly, the present invention has been developed to provide a logic signal multiplier circuit which overcomes the disadvantages of the above-known and similar techniques.

SUMMARY OF THE INVENTION

In accordance with the present invention, a logic signal multiplier circuit is formed which can be constructed using CMOS techniques. In one embodiment, the circuit is implemented using two inverters, each having an output and a capacitor coupled between the outputs of the inverters. Each of the inverters is controlled by a clock signal which defines three phases of operation such that (1) the capacitor between the outputs of the two inverters is charged during a first time period; (2) the voltage at a node of one of the inverters is increased to a value twice that of the supply voltage during a second time period; and (3) that same node of the inverter is coupled to ground during a third time period. Diodes are coupled in each of the inverters to prevent the discharge of the capacitor when certain transistors forming the inverters are conductive.

In another embodiment of the invention, a single control signal is coupled to a similar logic multiplier circuit to accomplish the same three phases of circuit operation as described above. In this instance, two additional transistors having conductivity types opposite to one another are coupled in one of the inverter circuits and driven by the single control signal to provide a logic gate which creates a logic OR function. The output from the previously mentioned node of the inverter is then inverted itself and provided through a delay coupling to the gates of transistors of the other inverter to produce the same three phases of operation referenced in the first embodiment with only one control signal.

In still another embodiment of the invention, multiple stages, each similar in construction to the individual inverters of the first embodiment, are coupled in parallel with one another. Nodes of adjacent stages are coupled by a capacitor and each of the stages are driven by a separate control signal to produce multiple stage operation analogous to that of the first embodiment.

It is therefore an object of the invention to provide a logic signal multiplier circuit which overcomes the disadvantages of the prior art.

Still another object of the invention is to provide a multiplier circuit having low power consumption.

Other objects, advantages and novel features of the invention will become apparent from the following detailed description when considered in connection with the accompanying drawings wherein:

BRIEF DESCRIPTION OF THE DRAWINGS

FIG. 1 illustrates one embodiment of a multiplier circuit in accordance with the present invention;

FIGS. 2a–2c illustrate the input and output signals of the circuit of FIG. 1;

FIG. 4a shows another embodiment depicting an n-stage multiplier circuit in accordance with the present invention; and FIGS. 4b–4d illustrate the control signals used for a three-stage circuit of the embodiment of FIG. 4a.

DETAILED DESCRIPTION OF PREFERRED EMBODIMENTS

Figure 3:
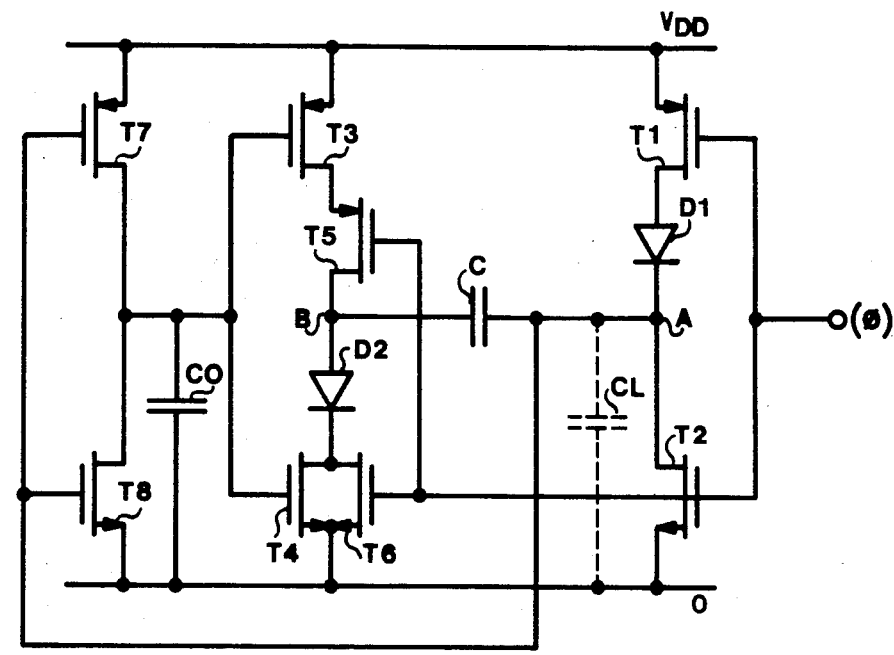
FIG. 3 illustrates another embodiment of a multiplier circuit requiring only a single control input.

Referring now to the drawings wherein like numerals are used to identify like elements throughout, FIG. 1 shows one embodiment of the multiplier circuit of the present invention. The circuit of FIG. 1 includes a first branch 1 which comprises a serial coupling of a first p-channel MOS transistor T1, a first diode D1 and a first n-channel MOS transistor T2 between the positive ($V_{DD}$) and negative (O) terminals of a source of supply voltage. The gate, source, and drain connections of the transistors T1 and T2 to the diode D1 and supply voltage terminals are as depicted in FIG. 1 to form a first inverter. The gates of the transistors T1 and T2 are electrically connected in common to form a first input terminal which is coupled to receive a first clock control signal ∅1. Likewise, the interconnection of the cathode of diode D1 with the drain of transistor T2 forms an output terminal defined as the node A.

A second branch 2 of the multiplier circuit is formed by the serial coupling of a second p-channel MOS transistor T3, a second diode D2 and a second n-channel MOS transistor T4 between the same positive ($V_{DD}$) and negative (O) terminals of the source of supply voltage. The gate, source and drain terminals of the transistors T3 and T4 are coupled in the configuration shown with the diode D2 and supply voltage terminals to define a second inverter having an output terminal defined as the node B. Likewise, the gates of transistors T3 and T4 are electrically connected in common to form a second input terminal coupled to receive a clock control signal ∅2.

The multiplier circuit of FIG. 1 further includes a capacitor C having one terminal connected to the common point between the diode D1 and transistor T2 defined by the node A and the other terminal connected to the common point between the transistor T3 and the diode D2 defined by the node B. Also shown are the dotted line illustrations of capacitors CL and Cp wherein CL represents the charge at the output node A and Cp represents the parasitic charge at the output node B.

Referring now to the FIGS. 2a–2c, the operation of the circuit of FIG. 1 will now be described with respect to the supply of clock control signals ∅1 and ∅2, as shown in FIGS. 2a and 2b, and the resulting voltages provided at nodes A and B, respectively, as shown in FIG. 2c. FIGS. 2a and 2b each show one of the clock control signals wherein each clock control signal is defined by a two-state logic waveform including a logic "0" state and a logic "1" state. During a first phase of operation (phase I), the control signal ∅2 has a logic "1" state while the signal ∅1 has a logic "0" state during a first time period. During this phase, the transistors T1 and T4 are gated on to be conductive, while the transistors T2 and T3 are gated off to be nonconductive. At this time, the capacitor C is charged through the transistor T1 diode D1, diode D2 and the transistor T4 to a voltage defined as $V_A - V_B = V_{DD} - 2V_D$; where $V_A$ and $V_B$ are the voltages at nodes A and B, respectively, $V_{DD}$ is the supply voltage and $V_D$ is the voltage drop in each diode D1 and D2.

The waveforms of FIGS. 2a and 2b are configured to provide a second phase of operation (phase II) during a second time period. During the second phase of operation, the clock control signals ∅1 and ∅2 are both provided in the logic "0" state. At this time, the transistors T1 and T3 are gated on to be conductive while the transistors T2 and T4 are gated off to be nonconductive. Likewise, the voltage at node B increases to the value of the supply voltage $V_{DD}$, which causes the voltage at node A to increase to the value:

$$V_A = (V_{DD} - V_D)(1 + C/(C + CL));$$

where C is the capacitance of the capacitor C and CL the value of the capacitive charge at node A. As will be appreciated, the interconnection of the diode D1 between the transistor T1 and node A prevents discharging of the capacitor C through transistor T1 when it is conducting.

A third phase of operation (phase III) follows the second phase during a third time period in accordance with the waveforms of the control signals of FIGS. 2a and 2b. During the third phase, the clock control signals ∅1 and ∅2 are both provided in the logic "1" state. At this time, the transistors T1 and T3 are gated off to be nonconductive while the transistors T2 and T4 are gated on to be conductive. As a result, the voltage at node A is reduced as a result of the conductive path through transistor T2 to the negative (0) terminal of the source of supply voltage (0 volt or ground potential) which, in turn, causes a decrease of the voltage at node B to the negative value:

$$V = -(1 + C/(C + CL))(V_{DD} - V_D).$$

Again, as will be appreciated, the coupling of the diode D2 prevents discharging of the capacitor C through the transistor T4 when transistor T4 is conducting.

Referring now to FIG. 2c, there is illustrated the voltages developed at the outputs represented by node A and B, respectively, corresponding to the phases of operation produced by the control signals depicted in FIGS. 2a and 2b. The output signal at node A varies between 0 volt and substantially twice the value of the supply voltage $V_{DD}$ over the three phases of operation, while the output signal at node B varies substantially between $-V_{DD}$ and $+V_{DD}$. As a result, the output signal at node A can be used to control n-channel MOS transistor switches while still guaranteeing good operation of the switches even when they are floating. It is also possible to use the output signal at node B to control p-channel MOS transistor switches although, in practice, it may be preferable to use a control signal having a leading edge which rises as steeply as possible. In FIG. 1, such leading edge control can be achieved by employing clock control signals slightly shifted relative to those depicted in FIGS. 2a and 2b. Such control signals would be so configured that the trailing edges are in phase while the rising edge of ∅1 is delayed by an interval ΔT relative to the rising edge of ∅2.

As has been previously described, the operation of the circuit in response to the control signals of FIGS. 2a and 2b is such during phase I as to insure charging of the capacitor C. As will be seen in FIG. 2c, an intermediate level of voltage at the nodes A and B appears during this phase I. In most applications of the circuit, this intermediate voltage level is not inconvenient. However, it is clear that the phase I interval ΔT can be reduced by selecting the elements such that capacitor C has a low value, transistors T1 and T4 have large channels with low resistance to conduction, and diodes D1 and D2 have low resistances.

Referring now to FIG. 3, there is illustrated another embodiment of a multiplier circuit in which the control signals ∅1 and ∅2 are produced from a single control signal ∅. In this instance, the two branches of the multiplier circuit are again formed using the transistors T1–T4, capacitor C and the diodes D1 and D2 and form the capacitive charge CL of the node A. In addition, a p-type transistor T5 is connected in electrical series between transistor T3 and node B, while n-type transistor T6 is connected in parallel with transistor T4. The control signal ∅ is coupled to the gates of transistors T1 and T2 as well as to the gates of transistors T5 and T6. The interconnection of the pair of transistors T5 and T6 taken with the pair of transistors T3 and T4 form a logic gate which implements a logic "OR" function between the signal ∅ and the signal provided to the gates of the transistors T3 and T4. The signal provided to the gates of transistors T3 and T4 is a signal coupled from node A and inverted by an inverter formed by the serial interconnection of complementary transistors T7 and T8 between the terminals of the source of supply voltage, and delayed by coupling through the capacitor CO which has one terminal coupled to a common interconnection of the connected drains of transistors T7 and T8 and the connected gates of transistors T3 and T4 and the other terminal coupled to the negative terminal of the source of supply voltage. As a result, the circuit of FIG. 3 allows the use of a single control signal ∅ to produce the gating signals for transistors T1–T4 to insure the three phases of operation of the multiplier as described in connection with FIG. 1.

As will be appreciated, FIGS. 1 and 3 illustrate that it is necessary to implement the circuits with a technology which allows floating diodes, namely, diodes that can be connected to any points of the circuit apart from the substrate or the supply terminals. An example of a technique for manufacturing diodes which allow such a condition is described in Swiss Pat. No. 581904. Such diodes can be formed in a layer of polycrystalline silicon having contiguous regions doped by opposite-type dopants. Alternatively, another suitable solution is to employ the base-emitter diodes of a bipolar transistor having a collector coupled to the substrate of the circuit. Such a configuration is, for example, described in an article entitled "A CMOS Voltage Reference" by Yannis P. Tsividis et al in the *IEEE Journal of Solid-State Circuits*, Volume SC-13, No. 6, Dec. 1978, pp. 774–778.

Turning now to FIG. 4a, there is shown still another embodiment representing an n-stage multiplier circuit. Again, as can be seen by use of the same reference numerals, the circuit of FIG. 4 includes a first branch including the serial interconnection of transistors T1 and T2 with diode D1 to form an inverter between the terminals of a source of supply voltage and which is controlled by the clock control signal ∅1. Similarly, a second branch is formed by the serial interconnection of transistors T3 and T4 with diode D2 between the terminals of the source of supply voltage and controlled by a clock control signal ∅2. Likewise, the outputs for the multiplier circuit are defined by the nodes A and B, as depicted in FIG. 4a.

However, FIG. 4a additionally includes intermediate branches which are represented as a branch i depicted in FIG. 4a. Each intermediate branch is formed by a pair of transistors Ti and Ti+1 of complementary types serially connected with two diodes Di and Di+1 between the positive ($V_{DD}$) and negative (O) terminals of the source of supply voltage. The gates of the transistors of the intermediate branch are, furthermore, controlled by a clock control signal ∅i. A point common to the interconnections of the diodes of the intermediate branch (common coupling of cathode of diode Di and anode of diode Di+1) defines the node I of the intermediate branch. The node I of the intermediate branch is connected to node A of the first inverter through capacitor C1 and is also coupled to the node of the following intermediate branch (where more than one intermediate branch is employed) or to the node B of the second branch through capacitor Ci. It will be appreciated, that in the event of multiple branches, the node of a preceding intermediate branch is coupled to the node of the next succeeding intermediate branch through a capacitor for as many branches as are present. Likewise, for each intermediate branch, the gates of the transistors defining that intermediate branch are coupled in common to a separate clock control signal.

The operation of the circuit of FIG. 4a is analagous to the circuit of FIG. 1. It should be understood, however, that there are as many supplementary clock control signals ∅i as there are intermediate branches and that each intermediate branch plays the same role of branch 2 in the circuit operation for the branch which precedes it and also the same role as branch 1 in the circuit operation in connection with the intermediate branch which follows it.

Referring to FIGS. 4b–4d, there is shown the waveforms representing the control signals utilized in the circuit of FIG. 4a where three branches are employed, namely, branch 1, branch i and branch 2. Again, each of the clock control signals are defined by portions having logic "0" states and logic "1" states. In this instance, a phase I' occurs during which the control signals ∅i and ∅2 are in the logic "1" state while the control signal ∅1 is in the logic "0" state. At this time, the capacitor C1 is charged through the transistor T1, diode D1, diode Di+1 and transistor Ti+1. During another phase I", the control signal ∅2 is in the logic "1" state while the signals ∅1 and ∅i are in the logic "0" state. At this time, the capacitor Ci is charged through the transistor Ti, diode Di, diode D2 and transistor T4.

Thereafter, during the second phase (phase II) of operation, all of the control signals ∅1, ∅i and ∅2 are in the logic "0" state. At this time, the potential at node B increases to a value close to the supply voltage $V_{DD}$, the voltage of node I of the branch i increases to a value close to twice the supply voltage and the voltage at node A increases to a value close to 3 times the supply voltage. The actual value reached at node A depends upon the voltages which are permitted by the technology used to implement the circuit elements (e.g., breakdown voltage of the diodes) and the leakages existing at each node.

Following phase II, the third phase of circuit operation occurs (phase III) wherein all control signals ∅1, ∅i and ∅2 are provided with a logic "1" state. At this time, the potential at node A is decreased to 0 in accordance with the operation as previously described.

Obviously, many other modifications and variations of the present invention are possible in light of the above teachings. It is therefore to be understood that within the scope of the appended claims, the present invention may be practiced otherwise than as specifically described.

What is claimed is:

1. A voltage multiplier circuit for providing an alternating output voltage comprising:
    a first complementary MOS transistor inverter stage coupled between terminals of a source of supply voltage and having a control input terminal and an output node;
    at least one second complementary MOS transistor inverter stage coupled between said terminals of the source of supply voltage and having a control input terminal and an output node;
    a first capacitor coupled between the output nodes of said first and said at least one second inverter stage; and
    means for applying alternating control signals to the control inputs of said first and said at least one second inverter stages such that said capacitor charges during a first phase to produce a voltage at the output node of said first inverter stage which is approximately equal to said supply voltage, said capacitor charges during a second phase to produce an increased voltage at the output node of said first inverter stage which has a value greater than said supply voltage, and said output node of said first inverter stage is coupled during a third phase to decrease the voltage at said output node of said first inverter stage to substantially zero, whereby said output nodes of said first and second inverter stages produce alternating output voltages having peak to peak values substantially higher than said supply voltage.

2. The multiplier circuit of claim 1 wherein each inverter stage comprises a serial interconnection of two complementary MOS transistors and a diode, said diode of each inverter stage being coupled to prevent discharge of said capacitor during said second and third phases.

3. The multiplier circuit of claim 2 wherein the control signal for each inverter stage is a separate control signal and has a plurality of logic states which are coupled to gates of said MOS transistors to produce said three phases of operation.

4. The multiplier circuit of claim 3 wherein said at least one second inverter stage comprises a plurality of parallel coupled inverter stages and said first capacitor comprises a plurality of capacitors wherein each capacitor of said plurality of capacitors is coupled between the output node of one inverter stage and the output node of the next succeeding inverter stage.

5. The multiplier circuit of claim 4 wherein:
said first inverter stage includes a diode coupled in series with one of said MOS transistors of said first inverter stage between said output node of said first inverter stage and a positive terminal of said supply voltage;
a last inverter stage of said plurality of inverter stages includes a diode coupled in series with one of the MOS transistors of the last inverter stage between the output node of said last inverter stage and a negative terminal of said source of supply voltage; and
each of the other of said plurality of inverter stages has a first diode connected in series with one of said MOS transistors of the associated inverter stage between the output node of the associated inverter stage and the positive terminal of said source of supply voltage, and a second diode coupled in series with the other of said MOS transistors of the associated inverter stage between the output node of the associated inverter stage and the negative terminal of said source of supply voltage.

6. The multiplier circuit of claim 5 wherein each of said diodes are formed in a layer of polycrystalline silicon having contiguous regions doped by opposite dopant types.

7. The multiplier circuit of claim 5 wherein said multiplier circuit is formed on a substrate and each of said diodes are configured as a base-emitter junction of a bipolar transistor having a collector which is connected to said substrate.

8. The multiplier circuit of claim 1 wherein said means for applying said control signals to said control terminals provides said control signals such that said first capacitor charges during said second phase to produce a voltage at the output node of said at least one second inverter stage which is substantially equal to said supply voltage.

9. The multiplier circuit of claim 8 wherein each inverter stage includes means for preventing discharge of said first capacitor during said second and third phases.

10. The multiplier circuit of claim 9 wherein said means for providing control signals includes means for providing a first control signal to said first inverter stage and means for deriving a second control signal from said output voltage of said first inverter stage and providing said second control signal to said second inverter stage.

11. The multiplier circuit of claim 10 wherein:
said first inverter stage comprises the serial interconnection of a first pair of complementary transistors and a first diode, wherein gates of said first pair of transistors are coupled to receive said first control signal;
said at least one second inverter stage comprises a second and third pair of complementary transistors coupled to form a logic OR function, wherein the gates of said third pair of transistors are coupled to receive said first control signal and said second and third pairs of transistors are coupled such that said second pair and one of said transistors of said third pair are serially connected with a second diode and the other of said transistors of said third pair is coupled in parallel with one of the transistors of said second pair; and wherein said means for deriving a second control signal from said first control signal comprises:
a fourth pair of complementary transistors serially coupled between the terminals of said source of supply voltage and having gates coupled to the output node of said first inverter stage; and
a second capacitor having one terminal coupled to a common point between said serially coupled fourth pair of transistors and another terminal coupled to a negative terminal of said source of supply voltage, said one terminal of said second capacitor also being coupled to gates of said second pair of complementary transistors.

12. The multiplier circuit of claim 10 wherein each pair of complementary transistors are MOS transistors.

13. A logic multiplier circuit comprising:
a first inverter stage including;
a first MOS transistor of one conductivity type having gate, drain and source terminals, said source terminal being coupled to the positive terminal of a source of supply voltage,
a first diode having an anode coupled to the drain terminal of said first MOS transistor and a cathode, and
a second MOS transistor of opposite conductivity type to said first MOS transistor and having gate, drain and source terminals, said drain terminal of said second MOS transistor being coupled to the cathode of said first diode and said source terminal of said second MOS transistor being coupled to a negative terminal of said source of supply voltage, said gates of said first and second MOS transistors being coupled in common to provide a first control input terminal;
a second inverter stage including;

a third MOS transistor of the same conductivity type as said first MOS transistor and having gate, drain and source terminals, said source terminal of said third MOS transistor being coupled to said positive terminal of said source of supply voltage, a second diode having an anode coupled to the drain terminal of said third MOS transistor and a cathode, and a fourth MOS transistor of the same conductivity type as said second MOS transistor and having gate, drain and source terminals, said drain terminal of said fourth MOS transistor being coupled to the cathode of said second diode and the source terminal of said fourth MOS transistor being coupled to the negative terminal of said source of supply voltage, said gates of said third and fourth MOS transistors being coupled in common to form a second control input terminal; and a capacitor having a first terminal coupled to the cathode of said first diode and a second terminal coupled to the anode of said second diode, said cathode of said first diode forming an output terminal of said first inverter stage and said anode of said second diode forming an output terminal of said second inverter stage.

14. A logic multiplier circuit comprising:

a first inverter stage including;

a first MOS transistor of one conductivity type having gate, drain and source terminals, said source terminal being coupled to the positive terminal of a source of supply voltage, a first diode having an anode coupled to the drain terminal of said first transistor and a cathode, and a second MOS transistor of opposite conductivity type to said first MOS transistor and having gate, drain and source terminals, said drain terminal of said second MOS transistor being coupled to the cathode of said first diode and said source terminal of said second MOS transistor being coupled to a negative terminal of said source of supply voltage, said gates of said first and second MOS transistors being coupled in common to provide a first control input terminal;

a second inverter stage including;

a third MOS transistor of the same conductivity type as said first MOS transistor and having gate, drain and source terminals, said source terminal of said third MOS transistor being coupled to said positive terminal of said source of supply voltage, a fourth MOS transistor having a conductivity type and gate, drain and source terminals, the source terminal of said fourth MOS transistor being coupled to the drain terminal of said third MOS transistor, a second diode having an anode coupled to the drain terminal of said fourth MOS transistor and a cathode, a fifth MOS transistor of the same conductivity type as said second MOS transistor and having gate, drain and source terminals, said drain terminal of said fifth MOS transistor being coupled to the cathode of said second diode and the source terminal of said fourth MOS transistor being coupled to the negative terminal of said source of supply voltage, a sixth MOS transistor having a conductivity type opposite to said fourth MOS transistor and having gate, drain and source terminals, said drain and source terminals of said sixth MOS transistor being coupled to the drain and source terminals, respectively, of said fifth MOS transistor and said gates of said fourth and sixth MOS transistors being coupled to said first control input terminal;

a first capacitor having a first terminal coupled to the cathode of said first diode and a second terminal coupled to the anode of said second diode, said cathode of said first diode forming an output terminal of said first inverter stage and said anode of said second diode forming an output terminal of said second inverter stage;

a seventh MOS transistor having a conductivity type and having gate, drain and source terminals, said source terminal of said seventh MOS transistor being coupled to the positive terminal of said source of supply voltage;

an eighth MOS transistor having a conductivity type opposite to said seventh MOS transistor and having gate, drain and source terminals, said drain terminal of said seventh and eighth MOS transistors being coupled together and said source terminal of said eighth MOS transistor being coupled to the negative terminal of said source of supply voltage, said gate terminals of said seventh and eighth MOS transistors being coupled to the cathode of said first diode; and a second capacitor having a first terminal coupled to the gate terminals of said third and fifth MOS transistors and to the drain terminals of said seventh and eighth MOS transistors and a second terminal coupled to the negative terminal of said source of supply voltage.

* * * * *